United States Patent [19]

Pardis

[11] 4,063,161
[45] Dec. 13, 1977

[54] BURIED CABLE FAULT LOCATOR WITH EARTH POTENTIAL INDICATOR AND PULSE GENERATOR

[75] Inventor: Robert J. Pardis, Darien, Ill.

[73] Assignee: Joslyn Mfg. and Supply Co., Chicago, Ill.

[21] Appl. No.: 567,816

[22] Filed: Apr. 14, 1975

[51] Int. Cl.$^2$ .................. G01R 31/08; H02M 3/18
[52] U.S. Cl. ................................. 324/52; 307/110; 324/9; 324/64; 324/65 P; 363/60
[58] Field of Search .............. 324/9, 52, 54, 67, 149, 324/65 P, 64; 307/110; 321/15; 315/227

[56] References Cited

U.S. PATENT DOCUMENTS

| | | | |
|---|---|---|---|
| 2,422,644 | 6/1947 | Martenet | 324/54 |
| 2,789,268 | 4/1957 | Bechtel | 324/66 |
| 2,907,949 | 10/1959 | Rogers et al. | 324/65 P |
| 3,299,351 | 1/1967 | Williams | 324/52 |
| 3,488,580 | 1/1970 | Anderson et al. | 324/52 |
| 3,582,719 | 6/1971 | Stuckens | 307/110 X |
| 3,629,651 | 12/1971 | Linkroum | 307/110 X |
| 3,711,767 | 1/1973 | Campbell et al. | 324/52 X |
| 3,792,350 | 2/1974 | Bossler et al. | 324/52 |
| 3,803,570 | 4/1974 | Barlow et al. | 324/65 P X |
| 3,810,000 | 5/1974 | Aspinall et al. | 324/9 X |
| 3,824,447 | 7/1974 | Kuwabara | 307/110 X |
| 3,924,179 | 12/1975 | Dozier | 324/67 X |

FOREIGN PATENT DOCUMENTS 20,980    1971    Japan ................................. 307/110

Primary Examiner—Gerard R. Strecker
Attorney, Agent, or Firm—Mason, Kolehmainen, Rathburn & Wyss

[57] ABSTRACT

A fault locator of the earth potential gradient type for locating faults in underground, unshielded, insulated, electrical power cables includes a high voltage pulsing unit for generating and applying high voltage pulses to a faulted power cable. The pulses pass through the power cable, out of the electrical fault, through the earth and back to the pulsing unit. The passage of the pulses through the earth forms potential differences between locations in the earth. These potential differences are monitored by a monitoring unit formed by a fault locator meter and a pair of probes inserted into the earth. The fault locator meter includes a galvanometer for indicating the potential differences and a control circuit that has high gain, automatic gain control, automatic needle centering, automatic earth potential offset compensation and a momentary contact switch to reduce the power drain. The fault locator meter is also easily and rapidly physically and electrically connectable to and disconnectable from a meter probe that may be readily driven into the earth using operator foot force and body weight alone. Thus, the need for a cable attachment between the fault locator meter and the meter probe is eliminated. The fault locator meter is used in connection with one or more remote probes that may be inserted into the earth in holes previously made by the meter probe. Using two remote probes can enable the fault locator meter to monitor approximately twice the potential difference in the earth than possible when using a single remote probe and the meter probe. The use of the two remote probes automatically electrically disconnects the fault locator meter from the meter probe. Each of the remote probes includes a coiled cable that is fixedly mounted on the remote probe for storage with the remote probe and that may be uncoiled to attach the remote probe to the fault locator meter. The pulsing unit includes a pulse generator having a bank of capacitors and a switching circuit for charging the bank of capacitors in parallel, for discharging the bank of capacitors in series and for isolating the charging circuit from the output circuit of the pulse generator. A pair of remote probes having partially-encapsulated, toroidal electrodes may be used to locate faults in power cables disposed under paved surfaces.

13 Claims, 18 Drawing Figures

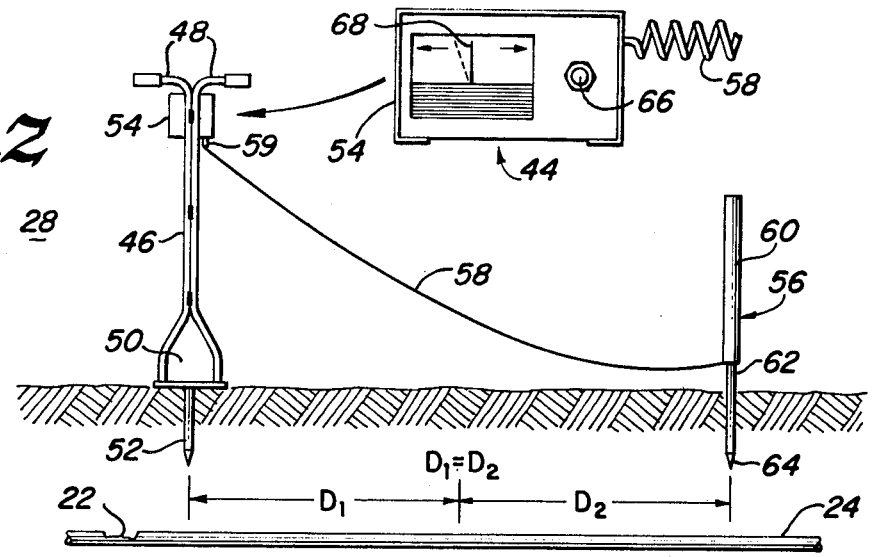
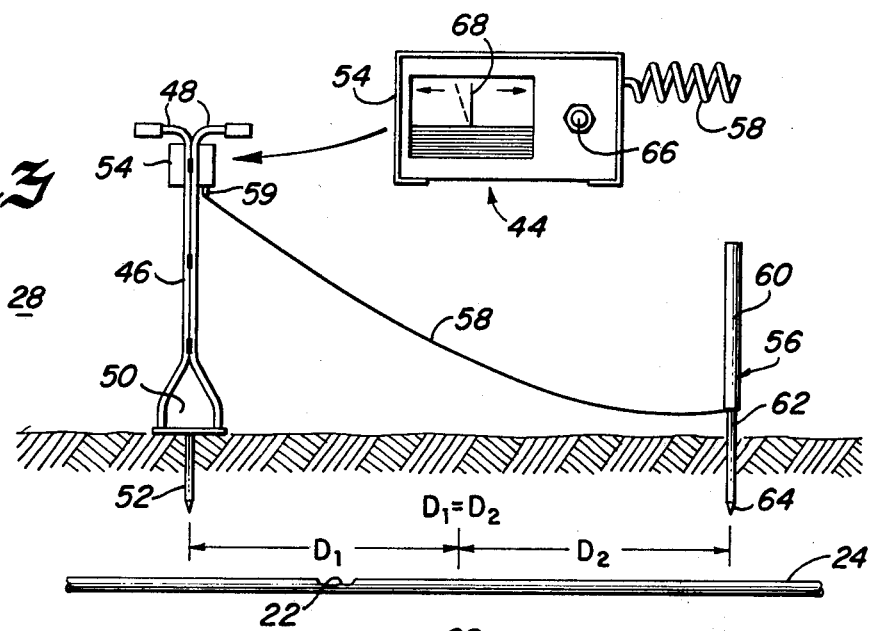
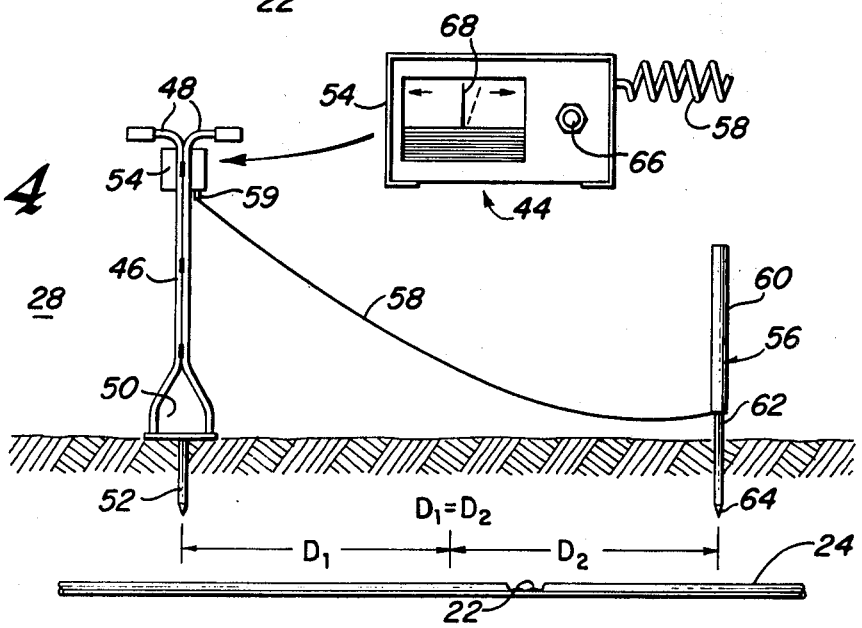

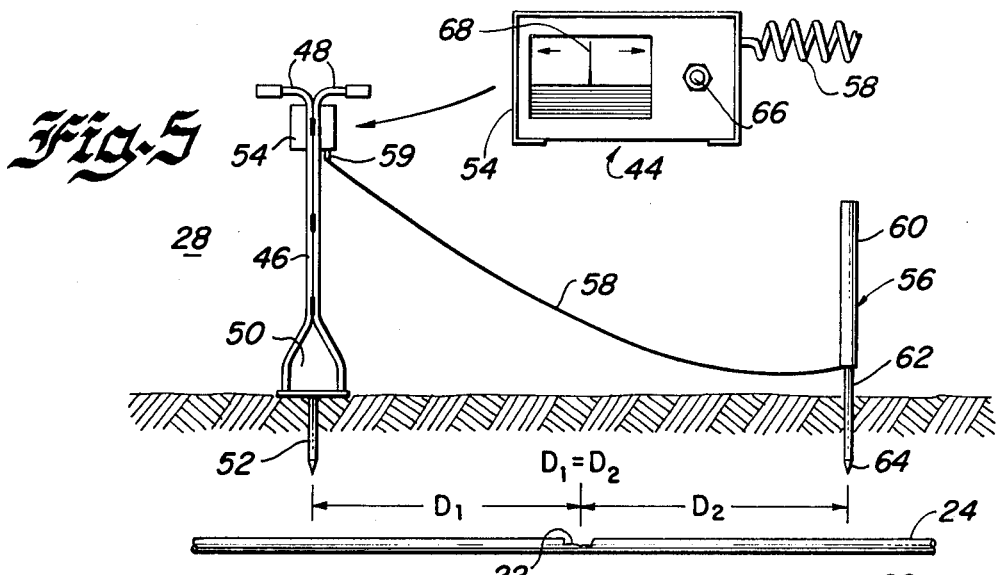
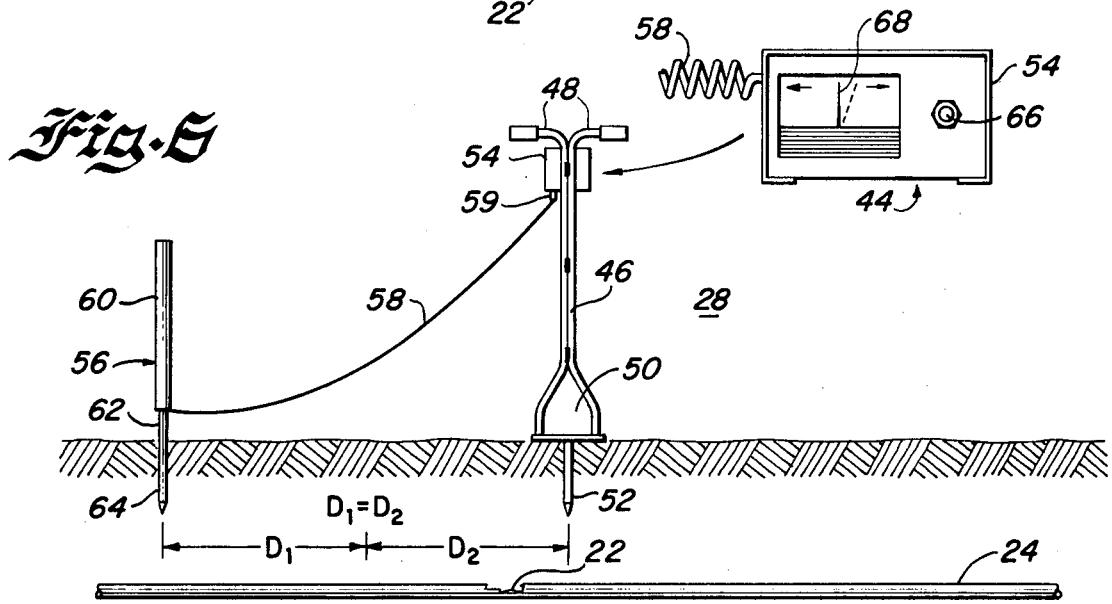
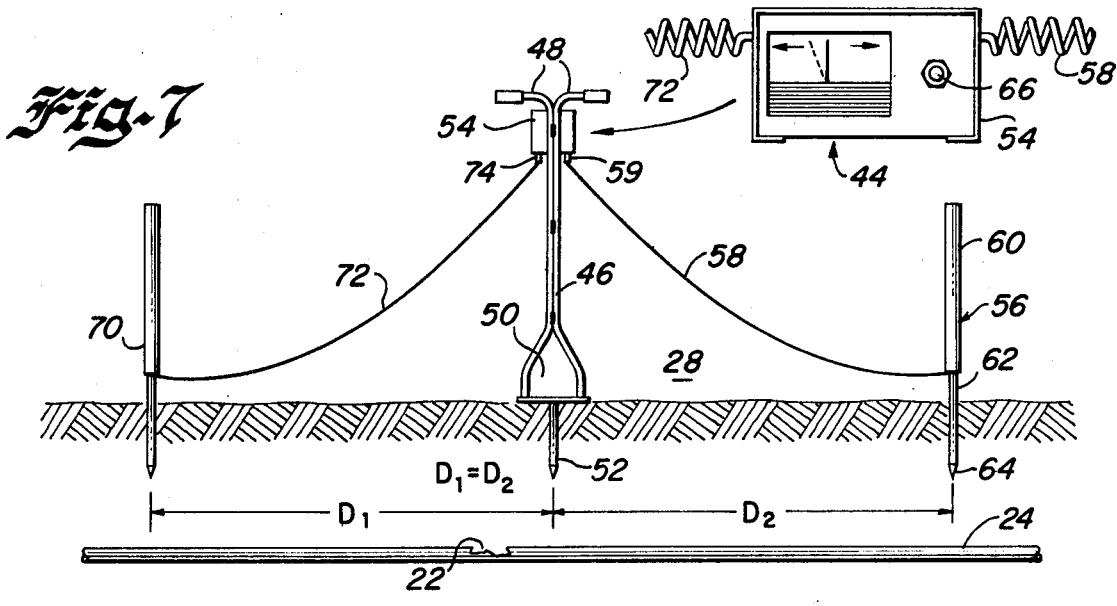

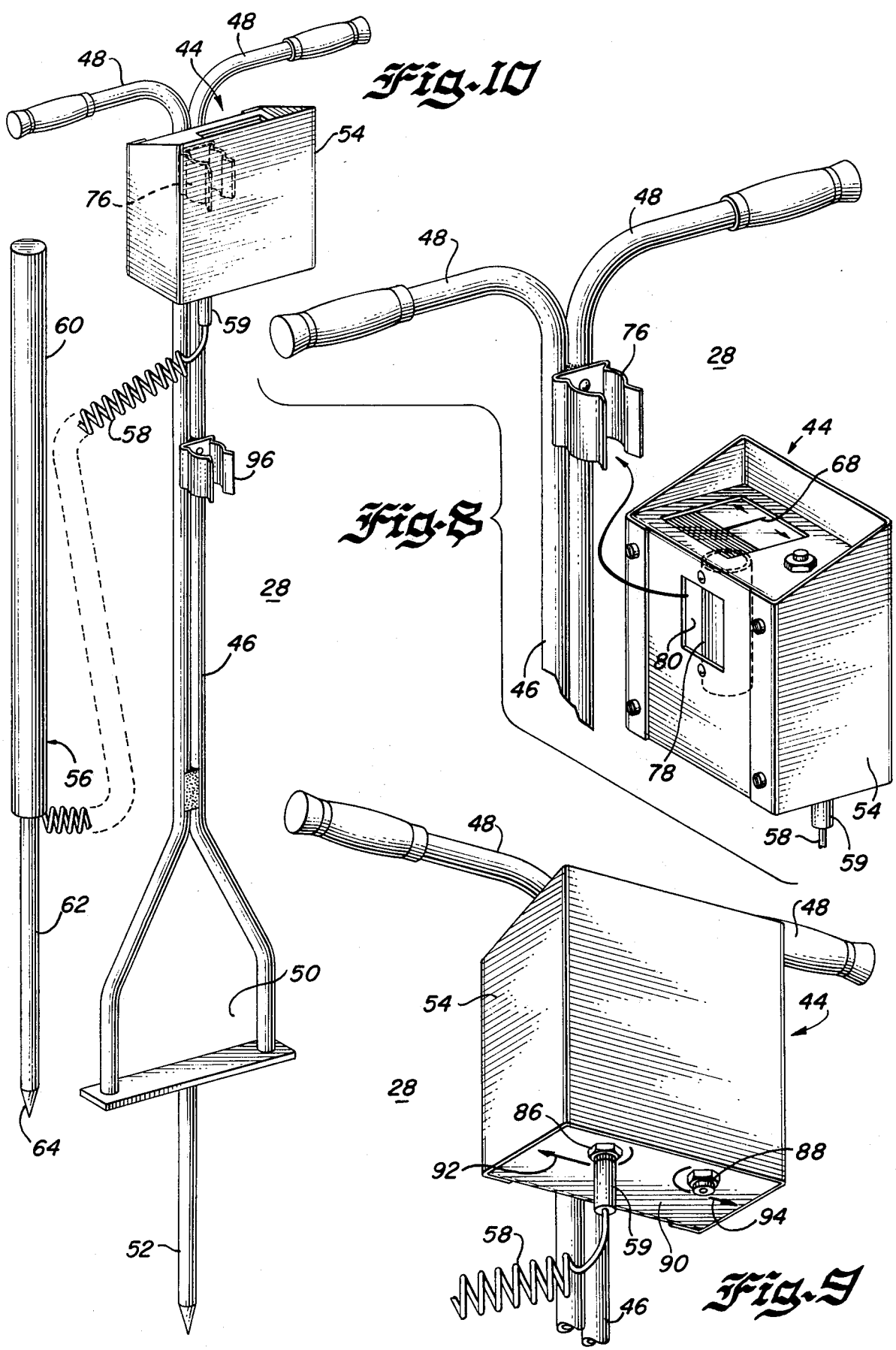

BURIED CABLE FAULT LOCATOR WITH EARTH POTENTIAL INDICATOR AND PULSE GENERATOR

BACKGROUND OF THE INVENTION

A. Field of the Invention

The present invention generally relates to devices and methods for locating faults in electrical power cables and, more particularly, to a fault locator of the earth potential gradient type for locating faults in underground electrical power cables.

B. Description of the Prior Art

Underground or buried electrical power cables often develop faults in which the insulation of the power cable is damaged and provides a low electrical resistance path to earth ground for the electrical power flowing through the power cable.

Many devices are currently available to locate the disposition of underground electrical power cables in the earth and to locate a fault along the length of the electrical power cable. One well known type of fault location device is generally referred to as an earth potential gradient fault location device. With this device, an electrical pulse from a pulsing unit is injected into the faulted power cable to subsequently exit through the fault into the earth and back to the pulsing unit. The pulse of current through the earth establishes a voltage drop across its path of travel through the earth. A potential difference normally exists across two points in the earth and may be monitored by a monitoring unit. The monitoring unit may include a galvanometer with a meter needle that deflects to indicate the location of the fault.

An example of a prior art earth potential gradient electrical fault locator is a model 412 Fault Finder manufactured and sold by Radar Engineers, Inc. Examples of other types of fault location apparatus include a device disclosed in U.S. Pat. No. 3,299,351; a device manufactured and sold by Associated Research, Inc. identified as model No. 8500; and a device manufactured by Jay Industries identified by the name THE PIN-POINTER.

Typical pulsing units used in prior art earth potential gradient fault locators generally are powered by 110 volt A.C. power supplies or 12 or 18 volt D.C. battery power supplies. Both of these types of power supplies require voltage converters to provide high voltage output pulses from the pulsing units. Typical voltage converters, for example, transformers or transistor inverters, are expensive, heavy and/or inefficient.

In addition, many of the prior art fault locating devices are characterized by relatively low voltage sensitivity and by manual controls for obtaining meter needle centering and the desired sensitivity. Prior art fault locating devices that include one or more remote probes that are inserted into the earth require an operator to expend much energy and time in repeatedly inserting the probes into the earth. In addition, typical prior art fault location devices include long cables for connecting remote probes to a fault locator meter. These long cables tend to become attached to miscellaneous debris and shrubbery present in the area of the fault. In addition, an operator becomes unnecessarily encumbered by the long cables in removing and reinserting one or more remote probes while simultaneously transporting a fault locator meter. Finally, prior art devices are generally relatively ineffective in locating faults under paved surfaces.

SUMMARY OF THE INVENTION

An object of the present invention is to provide a new and improved device for locating faults in electrical power cables.

Another object of the present invention is to provide a new and improved method for locating faults in electrical power cables.

Another object of the present invention is to provide a new and improved device for locating faults in underground, unshielded, insulated, electrical power cables.

Another object of the present invention is to provide a new and improved method for locating faults in underground, unshielded, insulated, electrical power cables.

Another object of the present invention is to provide a new and improved fault locator of the earth potential gradient type for locating faults in underground, unshielded, insulated, electrical power cables in a simple, efficient, facile and expeditious manner.

Another object of the present invention is to provide a new and improved earth potential gradient fault locator having a lightweight, inexpensive, efficient, direct current pulse generator that includes a switching circuit for charging a bank of capacitors in parallel, for discharging the bank of capacitors in series and for simultaneously isolating the charging or input circuit from the pulse or output circuit.

Another object of the present invention is to provide a fault locator meter mounted on a meter probe having a single prong that can be readily driven into compacted soil using operator foot force and body weight alone.

Another object of the present invention is to provide a new and improved fault locator meter having a control circuit including automatic gain control, high gain, automatic meter needle centering, automatic earth potential offset compensation and a momentary contact switch for energizing the control circuit to actuate the fault locator meter.

Another object of the present invention is to provide a new and improved fault locator meter which can be quickly and easily physically and electrically connected to and disconnected from a meter probe.

Another object of the present invention is to provide a new and improved remote probe for locating faults in underground, unshielded, insulated, electrical power cables disposed under paved surfaces.

Briefly, the present invention concerns a new and improved earth potential gradient type fault locator for locating faults in underground, unshielded, insulated, electrical power cables. The device includes a new and improved pulse generator, a new and improved fault locator meter and new and improved probes for sensing potential differences in the earth. The new and improved pulse generator includes a switching circuit for charging a bank of capacitors in parallel, for serially discharging the bank of capacitors and for isolating the input or charging circuit from the output circuit of the pulse generator. By charging the bank of capacitors in parallel and by subsequently serially discharging the bank of capacitors to produce a high voltage output pulse, the new and improved pulse generator eliminates the heavy and inefficient electrical transformers and other voltage converters typically found in prior art fault locators.

The new and improved fault locator meter includes a control circuit characterized by high gain, automatic gain control, automatic meter needle centering and automatic earth potential offset compensation. The fault locator meter further includes a momentary contact switch for energizing the fault locator meter only at the time the meter needle deflection is to be observed. In addition, the fault locator meter may be easily and rapidly physically and electrically connected to a meter probe having a single conductive prong that may be easily and rapidly inserted into compacted soil by operator foot force and body weight alone. The control circuit is automatically connected through a conductive tube of the fault locator meter to the meter probe upon the attachment of the fault locator meter to the meter probe. Subsequent to a fault location operation, the fault locator meter may be rapidly and easily physically and electrically detached from the meter probe.

One or more remote probes may be used in conjunction with the fault locator meter to locate a fault. The use of two remote probes can double the potential difference applied to the fault detection meter. Each of the remote probes includes a coiled cable affixed to a portion of the remote probe for storage therewith, and a cable connector for attaching the remote probe to the fault locator meter. Upon the insertion of the cable connectors from the remote probes into the fault locator meter, the control circuit of the fault locator meter is isolated from the meter probe.

A new and improved remote probe for detecting faults in underground, unshielded, insulated electrical power cables that lie below paved surfaces includes a partially encapsulated, toroidal conductive electrode.

BRIEF DESCRIPTION OF THE DRAWING

The above and other objects and advantages and novel features of the present invention will become apparent from the following detailed description of a preferred embodiment of the invention illustrated in the accompanying drawing wherein:

FIGS. 2 through 5 are diagrammatic views of the monitoring unit of the device of FIG. 1 illustrating the manner in which a fault may be located;

FIG. 6 is a diagrammatic view of an alternate mode of operation of the monitoring unit of the device of FIG. 1;

FIG. 7 is a diagrammatic view of another alternate mode of operation of the monitoring unit of the device of FIG. 1;

FIGS. 8 through 11 are different views of the monitoring unit of the device of FIG. 1 illustrating, in particular, the rapid and the facile manner of mounting a fault locator meter on a meter probe;

DESCRIPTION OF THE PREFERRED EMBODIMENT

Figure 1:
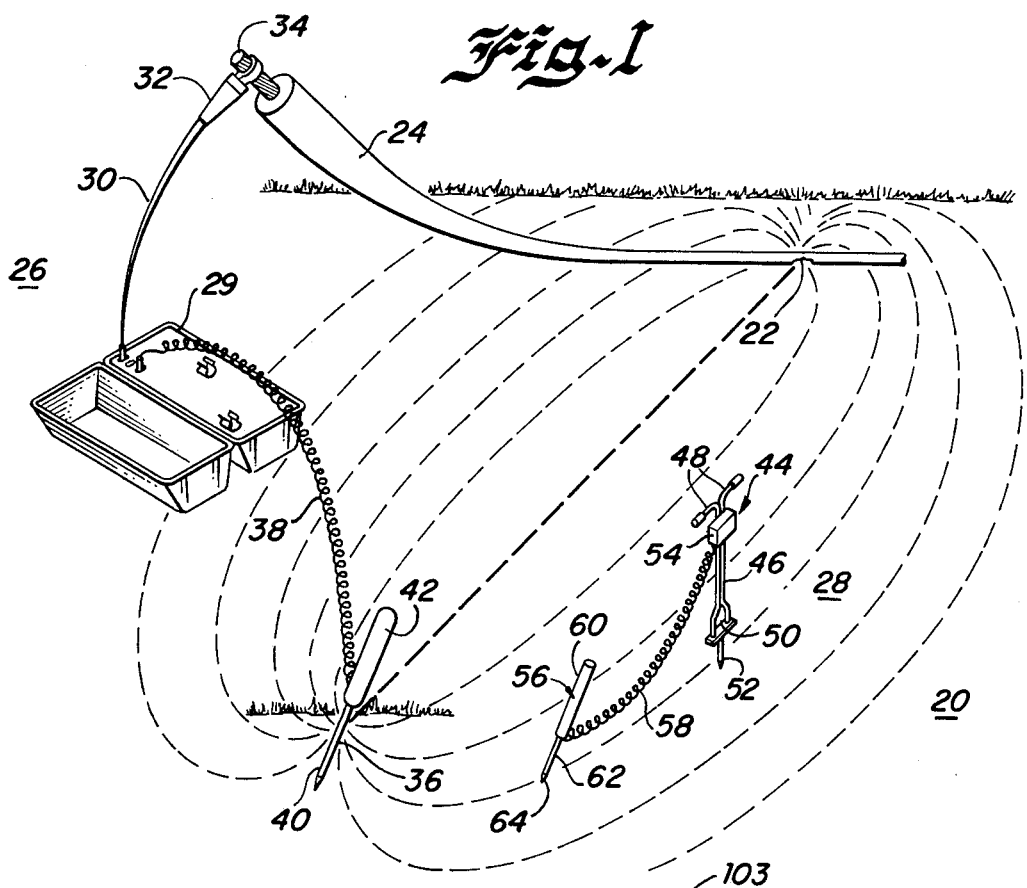
FIG. 1 is a diagrammatic perspective view of a preferred embodiment of a fault locator constructed in accordance with the principles of the present invention.

Referring to the drawing and initially to FIGS. 1 through 5, there is illustrated a new and improved fault locator 20 of the earth potential gradient type for locating faults 22 in underground, unshielded, insulated, electrical power cables 24. The fault locator 20 includes a pulsing unit 26 and a monitoring unit 28. The pulsing unit 26 includes a pulse generator 29, a cable lead 30 and a cable connector 32 for providing repetitive high voltage output pulses to a conductor 34 of the power cable 24. For example, in a specific embodiment of the present invention, the pulsing unit 26 provides a 420 volt output pulse approximately every 4 seconds. The pulsing unit 26 also includes a ground stake 36 and its coiled cable lead 38 to provide a ground return path for the output pulses. The ground stake 36 includes a conductive prong 40 extending from an insulated handle 42. The end of the prong 40 is preferably pointed to ease its insertion into compacted soil.

The output pulses from the pulsing unit 26 exit from the cable 24 through the fault 22. The output pulses exiting the cable 24 at the fault 22 establish pulse current flow in the earth, essentially as illustrated by the dotted lines in FIG. 1. In flowing from the fault 22 to the ground stake 36 to complete the electrical circuit, the output pulses establish potential gradients due to the resistance of the earth. By monitoring the potential differences in the earth, the fault 22 may be located.

The monitoring unit 28 is used to monitor potential differences in the earth and to thereby locate the fault 22 for subsequent repair. The monitoring unit 28 includes a fault locator meter 44 and a meter probe 46. The probe 46 includes a pair of handles 48 and a stirrup 50 to enable an operator to easily and quickly insert a single conductive prong 52 having a pointed lowermost end into compacted soil using operator foot force and body weight alone. The meter 44 may include a conductive meter case 54. The structural members of the probe 46 are also electrically conductive to thereby place the case 54 at the potential of the earth at the point of insertion of the prong 52 into the earth.

Figure 15:
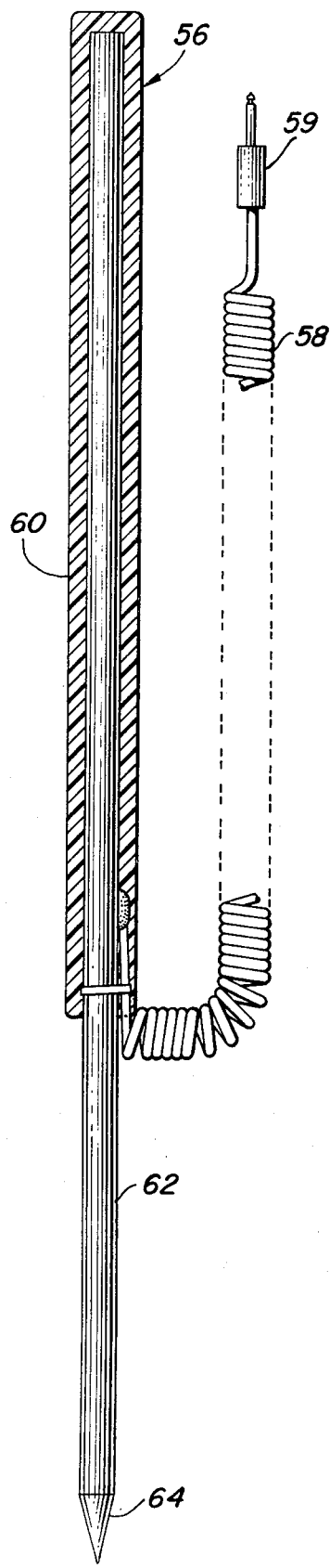
FIG. 15 is a partially elevational and partially cross-sectional view of a remote probe forming part of the monitoring unit of the device of FIG. 1.

The monitoring unit 28 further includes a remote probe 56 (FIG. 15) having a coiled cable lead 58 and a cable connector 59 for connecting the probe 56 to the meter 44. The lead 58 contracts when disconnected from the meter 44 into a relatively short coil for storage with the probe 56. The probe 56 further includes a relatively long insulated handle 60 fixedly secured to a conductive prong 62. The conductive prong 62 preferably includes a pointed end portion 64 to ease the insertion of the probe 56 into compacted soil. In a specific embodiment, the overall length of the probe 56 is 27 inches and the length of the insulated handle 60 is 17 ½ inches to enable an operator to insert the probe 56 into the earth without having to assume an uncomfortable body position.

Additionally, in accordance with an important feature of the present invention, the probe 46 (FIG. 1) is used as the lead probe and the probe 56 is used as the trailing probe. An operator may rapidly and easily form probe holes in the earth with the probe 46. Subsequently, the probe 56 may be positioned in the probe holes formed by the probe 46. Preferably, the diameter of the conductive prong 62 of the probe 56 is slightly smaller than the diameter of the conductive prong 52 of the probe 46 to enable the probe 56 to be easily inserted into holes formed by the probe 46.

In accordance with a further important feature of the present invention, a fault 22 (FIGS. 1 through 5) in the power cable 24 may be located in the following manner. Initially, the power cable 24 is completely deenergized. After isolating the power cable 24, the pulse generator 29 is positioned at a distance generally perpendicular to the length of the power cable 24 and electrically connected to the conductor 34 of the power cable 24 through the cable lead 30 and connector 32. The ground stake 36 is then extended as far as practical in the above-mentioned perpendicular direction and inserted into the earth. The probe 46 may be used to form a hole in the earth, especially in hard or compacted soil, for the ground stake 36. The pulsing unit 26 is then energized to apply repetitive high voltage pulses to the power cable 24.

The monitoring unit 28 is used to detect the repetitive pulses applied to the earth through the fault 22 and to locate the fault 22. Initially, after the meter 44 is attached to the probe 46 and the cable connector 59 to the meter 44, the probe 56 is inserted into the earth approximately 6 inches from the ground stake 36. If the soil is hard or compacted, the probe 46 may be used to form a hole in the soil for the probe 56.

Subsequently, the probe 46 is inserted into the earth approximately 3 to 4 feet from the probe 56. The probe 46 may be rotated about its longitudinal axis in order to insure that the cable lead 58 extends from the side of the meter 44 closest to the probe 56. Alternately, the cable connector 59 may be inserted into the appropriate side of the meter 44. After properly aligning the probe 46 and the probe 56, a momentary contact switch 66 (FIG. 2) is depressed; and an operator should observe the magnitude and direction of the deflections of a meter needle 68 from a null or center position.

The needle 68 is deflected by the repetitive pulses from the pulsing unit. The deflection of the needle 68 is in the direction of the probe 46 or 56, whichever is at a higher potential. By removing and reinserting the probe 46 into the earth several times radially about the probe 56 and by monitoring the magnitudes of the deflections of the needle 68, a rough directional indication to the location of the fault 22 may be obtained.

If the location and length of the power cable 24 are known, it normally is most expeditious to initiate further steps in a fault location procedure starting from the approximate center of the length of the cable 24. If the location and length of the cable 24 are not known, the operator may initiate further steps in a fault location procedure from the exposed end of the power cable 24.

Initially, the probe 56 is inserted into a hole formed in the earth by the probe 46, if necessary. Subsequently, the probe 46 is inserted into the earth at a point along the length of the cable 24 spaced from the probe 56 by the length of the uncoiled cable lead 58. Again the probe 46 may be rotated or the cable connector 59 removed and reinserted so that the side of the meter 44 into which the cable connector 59 is inserted faces the probe 56 (FIG. 2). Subsequently, the momentary contact switch 66 is depressed; and the deflection of the meter needle 68 is observed. If the deflection of the needle 68 is away from the probe 56, such a deflection indicates that the probe 46 is at a higher potential and, thus, is closer to the fault 22 than the probe 56. Alternately, such a deflection may be viewed as indicating that the fault 22 lies along the length of the cable 24 on the side of the midpoint between the probes 46 and 56 of the probe indicated as being at the highest potential, that is, the probe 46 in the case of FIG. 2 and FIG. 3.

On occasion, the sensitivity of the meter 44 may not be sufficient to respond to a slight potential difference between the probes 46 and 56. In such a situation, a second remote probe 70 (FIG. 7) may be used in conjunction with the probe 56 to essentially double the distance and, thus, the potential difference between the probes. The probe 70 is identical to the probe 56 and includes a coiled cable lead 72 and a cable connector 74 integrally attached to one end of the cable lead 72 for connecting the probe 70 to the meter 44. Attaching both of the connectors 59 and 74 to the meter 44 electrically disconnects and isolates the meter 44 from the conductive meter case 54 and from the probe 46. After the remote probe 70 is properly inserted into the earth and connected to the meter 44, the momentary contact switch 66 is depressed and the deflections of the meter needle 68 are observed. The deflections of the meter needle 68 are again in the direction of the probe 56 or 70 that is at the highest potential, that is, probe 70 in the case of FIG. 7.

Returning to the usual fault location procedure utilizing a single probe 56 (FIGS. 2–5), the next step in the procedure is to advance the probes 46 and 56 along the length of the cable 24 in the direction of the fault 22. The probe 56 is removed from its hole in the earth and may be reinserted in the hole previously formed by the probe 46. The probe 46 is then moved along the length of the cable 24 and inserted into the earth. Alternately, an operator may proceed along the length of the cable 24 to a more advanced location and reinsert the probes 46 and 56 into the earth. The deflections of the meter needle 68 are again observed; and the probes 46 and 56 are moved accordingly.

Eventually during a fault location procedure, the advance or leading probe 46 may be inserted beyond the fault 22 in the power cable 24 (FIG. 3), but still be more closely located to the fault 22 than the probe 56. In such a case, the meter needle 68 still deflects away from the probe 56.

Normally, the advance or leading probe 46 eventually becomes more greatly spaced from the fault 22 than the trailing probe 56 (FIG. 4). At this time, the meter needle 68 deflects in the direction of the probe 56 to indicate that the fault 22 has been passed by. In such a case, the probes 46 and 56 are reinserted into the earth until the depression of the momentary contact switch 66 results in no deflection of the meter needle 68, thereby indicating that the probes 46 and 56 (or the probes 56 and 70) are at the same potential.

The spacing between the probes 46 and 56 is then reduced while observing zero deflection of the meter needle 68 to thereby pinpoint the position of the fault 22. When the meter needle 68 does not move from its center position and the distance between the probes 46 and 56 is quite small, the fault 22 should underlie the earth at that location.

In order to be certain that the fault 22 has been located, the probe 56 may be placed in the earth at the indicated location of the fault 22; and the probe 46 inserted into the earth 3 to 4 feet from the probe 56. The momentary contact switch 66 is depressed; and the magnitude of the deflection of the meter needle 68 observed. The deflection of the meter needle 68 should be in the direction of the probe 56. After this observation, the probe 46 may be inserted at different radial positions about the probe 56; and the deflections of the meter needle 68 observed at each position of the probe 46. If there is a reversal in the deflection of the meter needle 68 at any position of the probe 46, assuming the probes 46 and 56 are properly aligned, the probe 56 is not positioned over the fault 22; and the fault location procedure should be continued. If, however, the fault 22 has been located, a hole may be dug in the earth to expose the cable 24 and the fault 22.

FIG. 6 illustrates the manner in which the probe 56 may be inserted into the opposite side of the meter 44. The fault location procedure is the same as that described above with respect to FIGS. 2 through 5.

FIGS. 8 through 11 depict the monitoring unit 28 and the manner in which the meter 44 may be easily and rapidly physically and electrically connected to and disconnected from the probe 46. The probe 46 includes a resilient clip 76 securely affixed to the probe 46 for removably receiving and securely engaging a complimentarily shaped conductive elongated tubular member 78 securely physically and electrically attached to the conductive meter case 54. An elongated slot 80 is provided in the meter case 54 to provide access to the tubular member 78 for engagement with the resilient clip 76. The length of the slot 80 is approximately equal to the length of the resilient clip 76 to thereby prevent substantial vertical displacement of the meter 44 when secured to the probe 46.

A resilient clip 82 (FIG. 11) may be attached to the case 54 to securely retain a battery 84 that serves as the direct current power supply for the meter 44. A pair of cable jacks 86 and 88 (FIG. 9) are positioned at a lower end 90 of the meter 44 for receipt of one or more of the cable connectors 59 and 74. The jacks 86 and 88 are electrically short-circuited to the case 54 or, optionally, merely to the tubular member 78 as when a nonconductive meter case 54 is used. A pair of directional arrows 92 and 94 indicate the directions the cable leads 58 and 72 should assume when extended from the meter 44.

The probe 46 further includes a resilient clip 96 (FIG. 10) for removably securely engaging the insulated handle 60 of the probe 56. When the meter 44 is secured to the probe 46 by means of the resilient clip 76 and the tubular member 78 and when the probe 56 is secured to the probe 46 by means of the engagement of the insulated handle 60 by the resilient clip 96, the entire monitoring unit may be carried by an operator in one hand. This permits the operator to easily remove objects in his path or transport other objects during a fault location operation.

Figure 12:
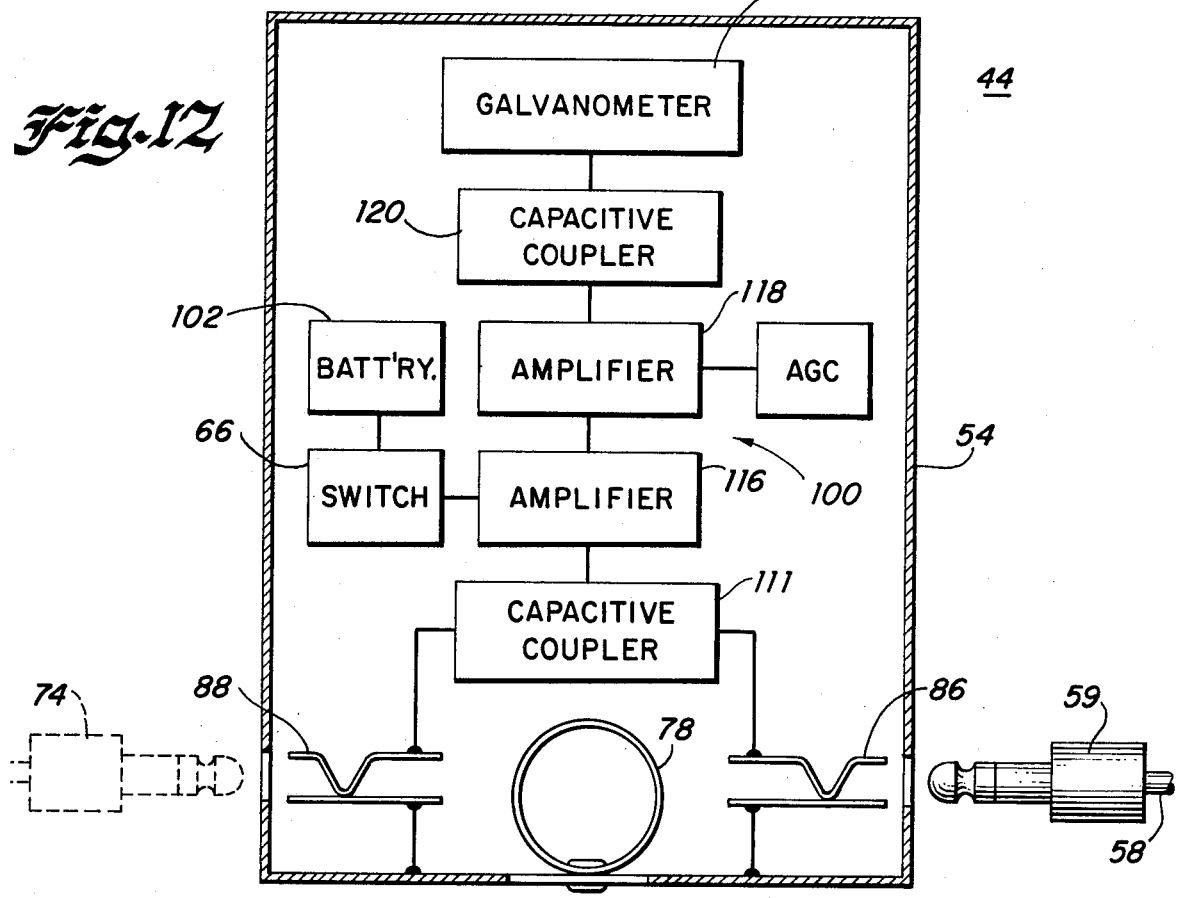
FIG. 12 is an electrical schematic diagram of the fault locator meter of the device of FIG. 1.

The meter 44 (FIG. 12) includes a meter control circuit 100, a conductive case 54 for applying the potential of the probe 46 to the control circuit 100, a pair of cable jacks 86 and 88, a galvanometer 103, a battery 102 providing a direction current power source for the control circuit 100 and the momentary contact switch 66 for energizing the control circuit 100.

Figure 13:
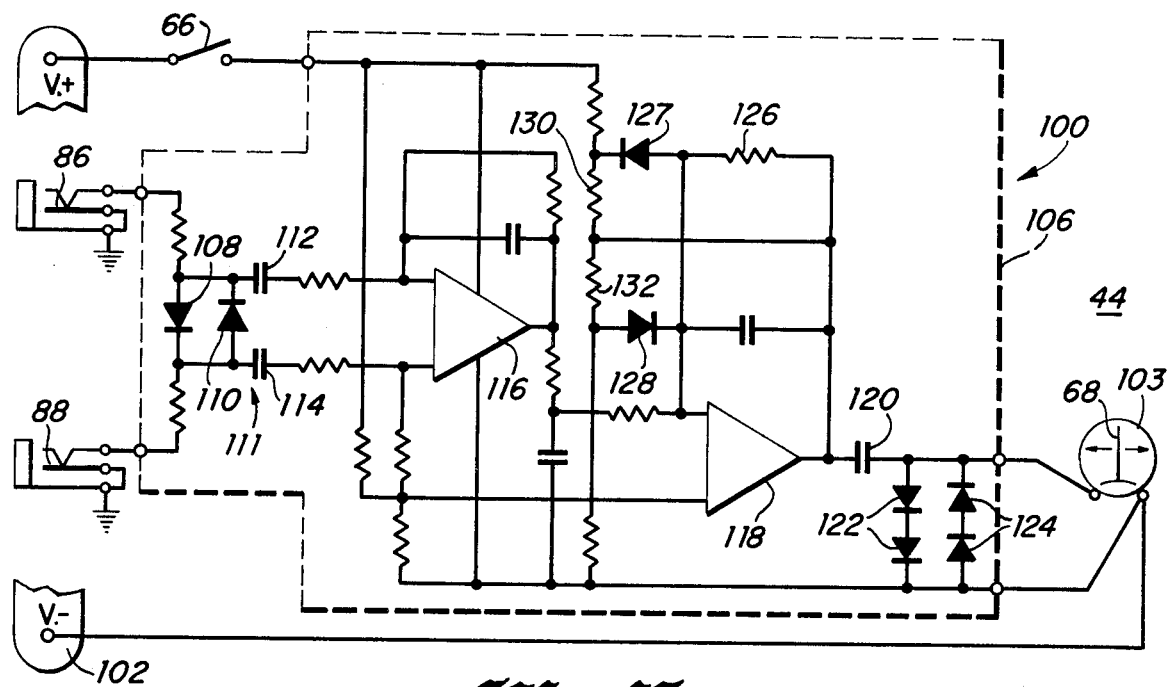
FIG. 13 is an electrical circuit diagram of the fault locator meter of the device of FIG. 1.

The pair of cable jacks 86 and 88 (FIG. 13) and the galvanometer 103 respectively provide the inputs to and the output from the control circuit 100. The battery 102 provides direct current power to energize the control circuit 100 through the momentary contact switch 66. The components of the control circuit 100 may be mounted on a printed circuit board 106 (indicated by the dotted lines in FIG. 13).

A pair of oppositely poled diodes 108 and 110 function as voltage limiters to protect the control circuit 100 from overly large input signals. The input signal to the control circuit 100 is integrated by a capacitive coupler 111 formed by a pair of capacitors 112 and 114 for application to a first amplifier 116. The capacitors 112 and 114 prevent any residual potential offset in the earth at the locations of the conductive probes 46 and 56 in the absence of output pulses from the pulsing unit 26 from providing an erroneous input signal to the control circuit 100.

A second amplifier 118 receives an inverted output signal from the amplifier 116 and provides an inverted output signal through a capacitive coupler or capacitor 120 to the galvanometer 103 to cause an appropriate deflection of the meter needle 68. A plurality of pairs of oppositely poled diodes 122 and 124 limit the magnitude of the signal from the amplifier 118 to thereby prevent damage to the galvanometer 103. The capacitor 120 eliminates the need for an operator to null or center the meter needle 68 during a fault location procedure.

The output signal from the amplifier 118 is fed back to the input of the amplifier 118 through a resistor 126 and is summed with the output signal from the amplifier 116 to provide automatic gain control of the amplifier 118. If the output signal from the amplifier 118 is greater than the threshold level of one of two oppositely poled diodes 127 and 128, the feedback signal is increased by passage through a parallel resistive path formed by the resistor 126 and either a resistor 130 and the diode 127 or a resistor 132 and the diode 128 to thereby reduce the input signal to the amplifier 118 and thus the output signal from the amplifier 118.

In this manner, the control circuit 100 eliminates the numerous operator adjustments typically present in prior art monitoring units. The operator is merely required to depress the momentary contact switch 66 and then observe the swing or deflection of the meter needle 68 from its null position. The control circuit 100 provides high gain, automatic gain control, automatic meter needle 68 centering and automatic earth potential offset compensation to thereby significantly increase the speed and ease of a fault location procedure.

Figure 14:
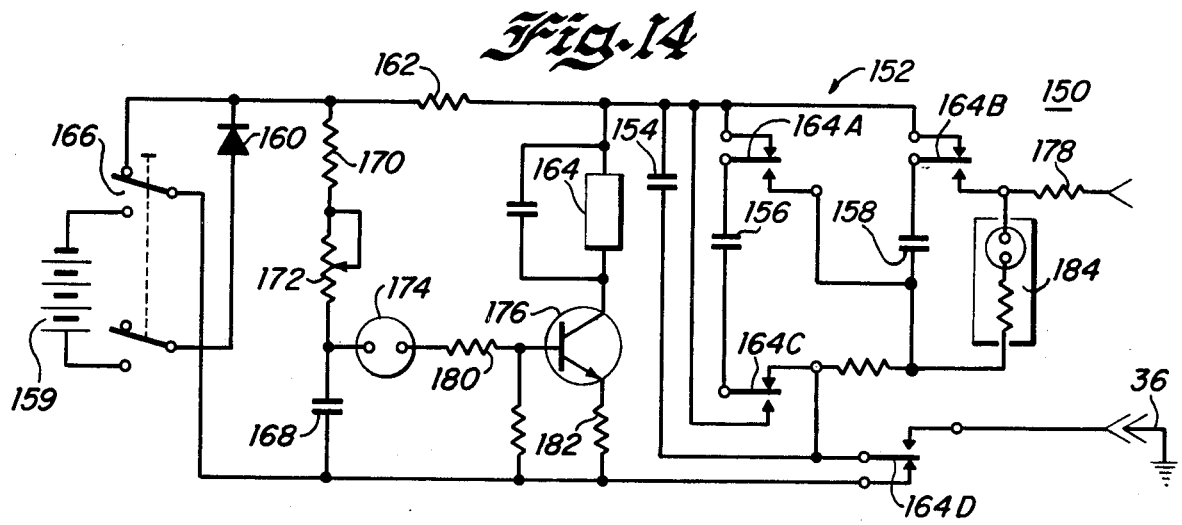
FIG. 14 is an electrical circuit diagram of the pulse generator of the device of FIG. 1.
Figure 11:
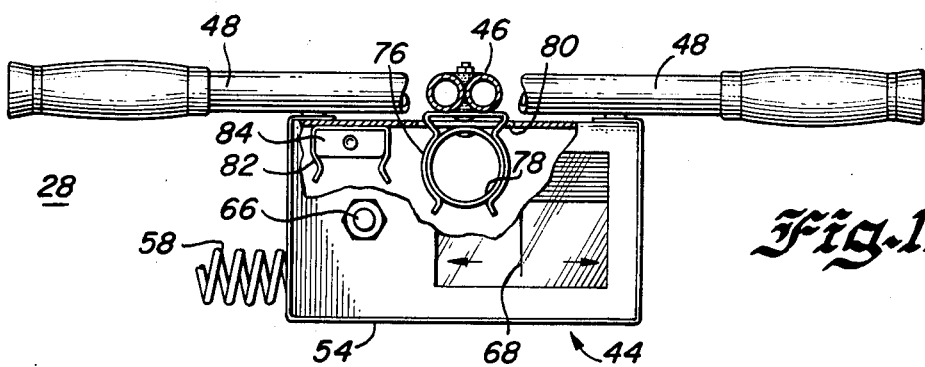

In accordance with a further important feature of the present invention, a new and improved pulse generator control circuit 150 (FIG. 14) includes a bank of capacitors 152 having a plurality of three capacitors 154, 156 and 158 that are charged in parallel and discharged in series to thereby provide a relatively high voltage output pulse from a relatively low voltage power source, such as a 138 volt battery power source 159, formed in a specific embodiment by two serially connected 69 volt batteries.

The circuit 150 includes a diode 160 serially disposed between the source 159 and the bank of capacitors 152 to insure that the source 159 is correctly connected in the circuit 150. Further, the diode 160 enables the circuit 150 to be energized by an alternating current power source, such as by a 110 volt A.C. power line.

A resistor 162 determines the charging rate of the bank of capacitors 152. A relay 164 and its associated movable relay contacts 164A through 164D control the charging and the discharging of the bank of capacitors 152 and isolate the charging portion of the circuit 150 from the output portion of the circuit 150 during the discharge of the bank of capacitors 152. When the relay 164 is deenergized and the relay contacts 164A through 164D are in their normal or deenergized state (FIG. 14), the bank of capacitors 152 is disposed for connection to the power source 159 through the resistor 162 and the diode 160. Switching a double-pole double-throw on/- off power switch 166 connects the power source 159 through the resistor 162 to the bank of capacitors 152, thereby charging the capacitors 154, 156 and 158 in parallel.

While the bank of capacitors 152 is being charged, a capacitor 168 is also being charged through a fixed resistor 170 and a variable resistor 172 which determine the charging rate of the capacitor 168 and, thus, the output pulse repetition rate of the circuit 150. When the capacitor 168 is charged to a voltage that equals or exceeds the firing voltage of a neon lamp 174, a transistor 176 becomes conductive to energize the relay 164 and to thereby cause the movable contacts 164A through 164D to switch to their opposite contacts, resulting both in the isolation of the charging portion of the circuit 150 from the output portion of the circuit 150 and in the connection of the capacitors 154, 156 and 158 in series to thereby provide a high voltage output pulse from the circuit 150.

The discharge rate of the capacitors 154, 156 and 158 and, thus, the minimum pulse width of the output pulses from the circuit 150 are determined by a resistor 178. When the capacitor 168 is discharged to a voltage below the minimum sustaining voltage of the neon lamp 174, the neon lamp 174 is extinguished placing the transistor 176 in its nonconductive state and deenergizing the relay 164. Deenergizing the relay 164 returns the relay contacts 164A through 164D to their normal or deenergized state (FIG. 14) to reinitiate the charging of the bank of capacitors 152.

The discharge rate of the capacitor 168 and, thus, the maximum pulse width of the output pulses from the circuit 150 are determined by the resistance of the serially connected resistors 180 and 182. A neon indicator lamp 184, when energized, visually indicates that the circuit 150 is energized and also functions as a rough indicator of the condition of the battery power source 159.

Figure 16:
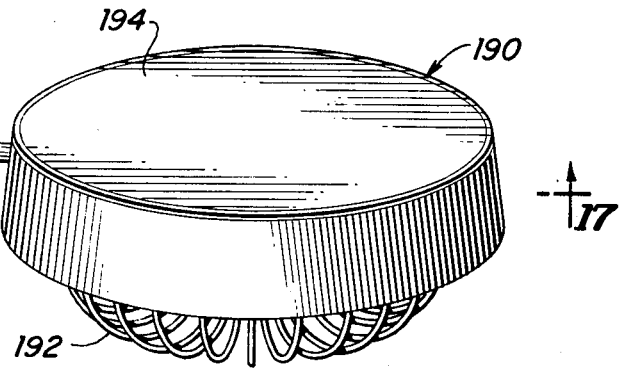
FIGS. 16 through 18 are different views of an alternate embodiment of a remote probe of the monitoring unit of the device of FIG. 1.
Figure 17:
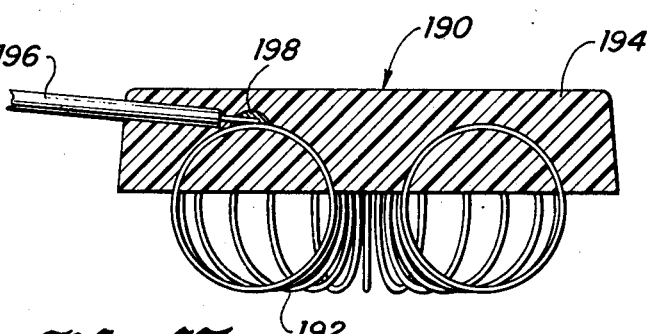
Figure 18:
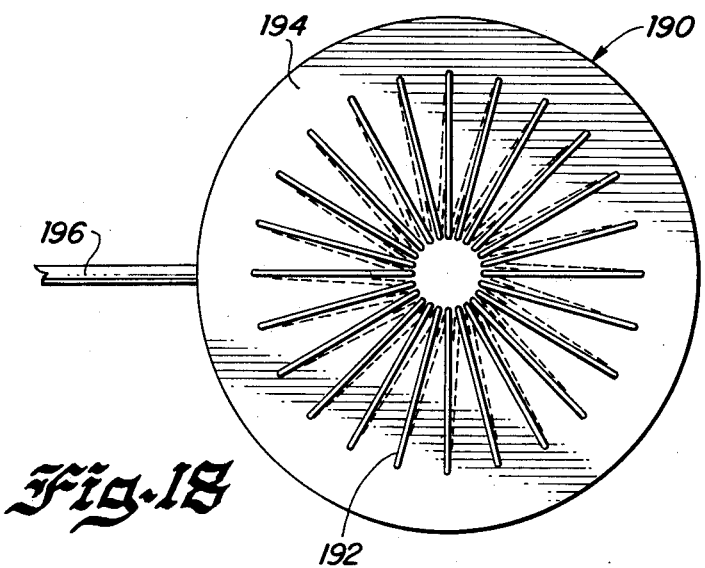

In accordance with another important feature of the present invention, a new and improved remote probe 190 (FIGS. 16 through 18) is used to detect potentials under paved surfaces and includes a toroidal conductive electrode 192 partially encapsulated within a molded insulating housing 194, formed in a specific embodiment from an epoxy resin. The probe 190 includes a fragmentarily illustrated coiled cable lead 196 electrically connected, such as by the solder bond 198, to the electrode 192 and extending from the housing 194 and a cable connector (not shown) essentially identical to the cable connector 59 (FIG. 15) at the opposite end (not shown) of the coiled cable lead 196. The probe 190 may be used in pairs in essentially the same manner as illustrated with respect to the use of the two probes 56 and 70 (FIG. 7).

In order to increase the sensitivity of the probes 190, the paved surface may be wetted down prior to detecting the potential difference between a pair of spaced probes 190. After wetting the paved surface, the probes 190 are spaced apart and the electrodes 192 placed in contact with the paved surface. The subsequent steps of the fault location procedure are essentially the same as those discussed above.

Obviously, many modifications and variations of the present invention are possible in light of the above teachings. Thus, it is to be understood that, within the scope of the appended claims, the invention may be practiced otherwise than as specifically described.

What is claimed and desired to be secured by Letters Patent of the United States is:

1. An earth potential gradient fault location device operable by a single operator for locating a fault to earth ground in a buried portion of an insulated power cable comprising means adapted for energization by a battery power source for generating repetitive high voltage electrical pulses for application to said cable to generate potential gradients in the earth to aid in locating said fault, said generating means comprising an electrical power source, a plurality of capacitors and means for charging in parallel said plurality of capacitors from said power source and for discharging in series said plurality of capacitors to form said repetitive high voltage electrical pulses, and means for monitoring potential differences in the earth and the polarity thereof established by said repetitive pulses, said monitoring means comprising probe means for obtaining the potential difference between two earth locations and means responsive to said potential difference for providing a visually perceptible indication of said potential difference to said operator, said potential difference monitoring means including means including direct current blocking means for automatically maintaining said visually perceptible indication providing means in a null condition in the absence of said pulses.

2. A device as recited in claim 1 wherein said electrical power source comprises an alternating current power source and wherein said charging and discharging means comprises means connected to said alternating current power source and to said capacitors having a first condition of operation for charging said capacitors from said alternating current power source and a second condition of operation for electrically isolating said plurality of capacitors from said alternating current power source during the discharging of said plurality of capacitors.

3. A device as defined in claim 1 wherein said power source consists of a battery.

4. A device as recited in claim 1 wherein said means for charging and discharging comprises a relay formed by a relay coil, a plurality of relay contacts operated by said relay coil and electrically coupled to said power source and said capacitors, and timing means for repetitively energizing and deenergizing said relay coil to thereby establish a pulse repetition rate of said repetitive pulses.

5. A device as defined in claim 1 further comprising a half-wave rectifier serially electrically connected between said power source and said plurality of capacitors.

6. A device as recited in claim 1 wherein said potential difference monitoring means includes means for amplifying said potential differences, and said direct current blocking means is connected to said amplifying means for coupling said pulses to said visually perceptible indication providing means while blocking the application of continuous direct current signals to said visually perceptible indication providing means.

7. A device as defined in claim 6 wherein said direct current blocking means includes a capacitor.

8. A device as defined in claim 7 wherein said capacitor is interposed between said amplifying means and said visually perceptible indication providing means.

9. A device as defined in claim 7 wherein said capacitor is interposed between said probe means and said amplifying means.

10. A device as recited in claim 6 wherein said potential difference monitoring means includes means for automatically controlling the gain of said amplifying means.

11. A device as defined in claim 1 wherein said probe means comprises one probe having a longitudinally extending body portion, a single longitudinally extending conductive prong having a longitudinal axis for insertion into the earth, and a portion transverse to said prong for enabling the engagement of an operator's foot to insert at least a portion of said conductive prong into the earth, said one probe being rotatable about said longitudinal axis of said prong while said prong is disposed in the earth.

12. A device as defined in claim 11 wherein said prong is centrally disposed along said transverse portion.

13. A device as recited in claim 1 wherein said probe means includes a generally toroidal conductive electrode partially encapsulated in an insulating housing and a coiled cable lead electrically connected to said conductive electrode and physically extending from said insulating housing and a cable connector attached to the free end of the coiled cable lead.

* * * * *